United States Patent [19]

Mitchell et al.

[11] Patent Number: 4,980,309
[45] Date of Patent: Dec. 25, 1990

[54] METHOD OF MAKING HIGH DENSITY EEPROM

[75] Inventors: Allan T. Mitchell, Garland; Bert R. Riemenschneider, Murphy, both of Tex.

[73] Assignee: Texas Instruments, Incorporated, Dallas, Tex.

[21] Appl. No.: 366,795

[22] Filed: Jun. 14, 1989

Related U.S. Application Data

[62] Division of Ser. No. 126,443, Nov. 30, 1987 Pat. No. 4,853,895.

[51] Int. Cl.⁵ .................... H01L 21/336; H01L 27/115
[52] U.S. Cl. ........................................ 437/43; 437/40; 437/52; 437/228
[58] Field of Search ............... 437/52, 43, 228, 40, 437/191, 193; 357/23.5; 365/182, 185, 186, 218

[56] References Cited

U.S. PATENT DOCUMENTS

| 4,742,492 | 5/1988 | Smayling et al. | 365/218 |
| 4,780,431 | 10/1988 | Maggioni et al. | 437/43 |
| 4,833,514 | 5/1989 | Esquivel et al. | 437/43 |
| 4,849,369 | 7/1989 | Jeuch et al. | 437/43 |
| 4,851,365 | 7/1989 | Jeuch | 437/43 |

Primary Examiner—Olik Chaudhuri
Assistant Examiner—T. Thomas
Attorney, Agent, or Firm—James C. Comfort; Melvin Sharp; Stanton C. Braden

[57] ABSTRACT

An electrically erasable, programmable read only memory (EEPROM) having an erase window directly overlying both a control gate layer (24) and a column line (12) is disclosed. Column lines (12) are implanted into a semiconductor substrate (16) and covered with a first insulating layer (18). A floating gate layer (20) overlies the first insulating layer (18) and is covered with a second insulating layer (22). The control gate layer (24) overlies the control insulating layer (22) and is covered by a third insulating layer (26). A passage (28) extends through the third insulating layer (26), control gate layer (24) and second insulating layer (22) and contains a sidewall insulator (30) on walls thereof. A tunnel oxide (32) resides within the passage (28) and is contacted by a programming electrode layer (34) which additionally overlies the third insulating layer (26) and fills the passage (28).

5 Claims, 1 Drawing Sheet

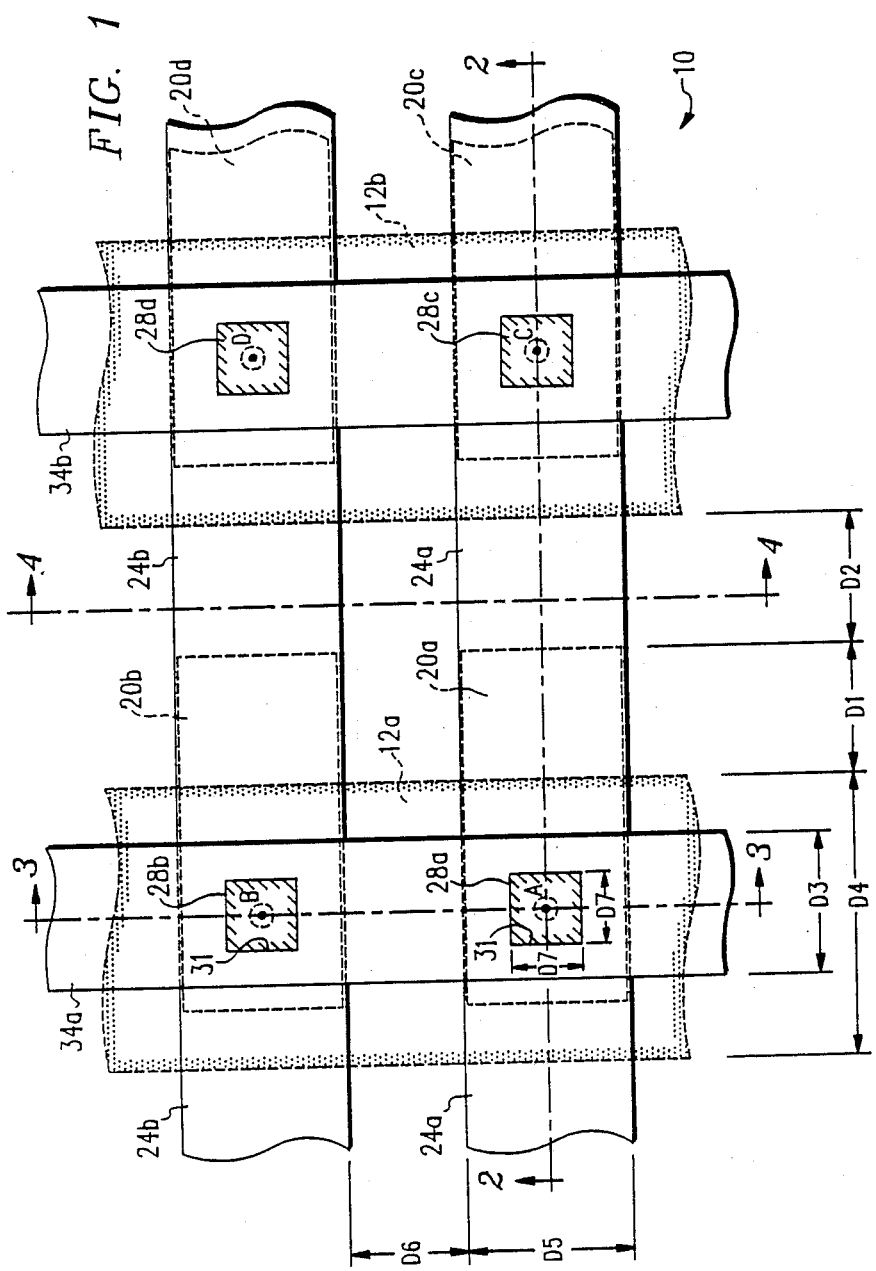

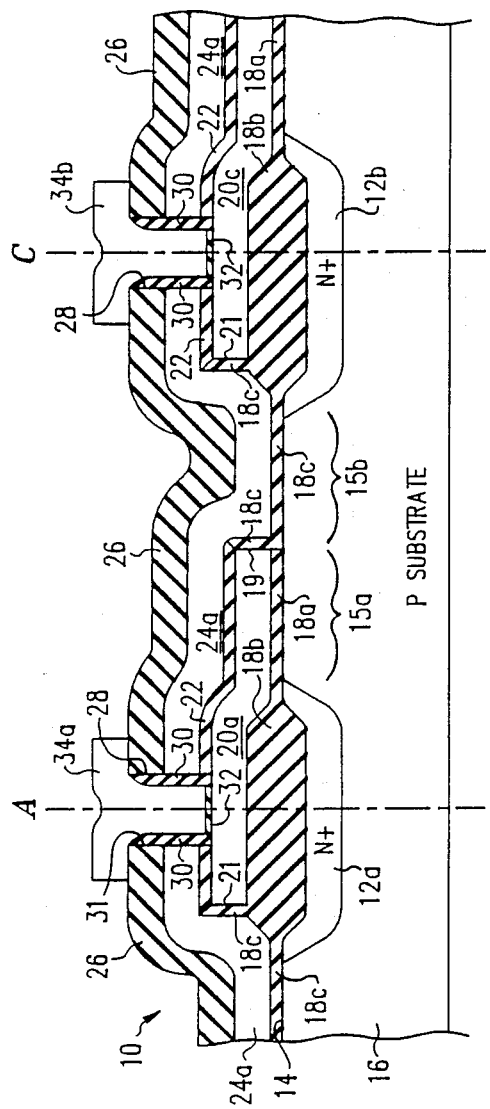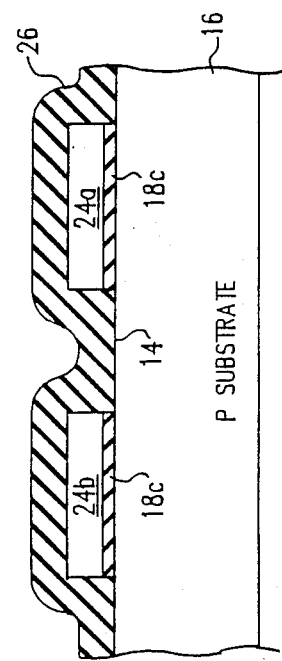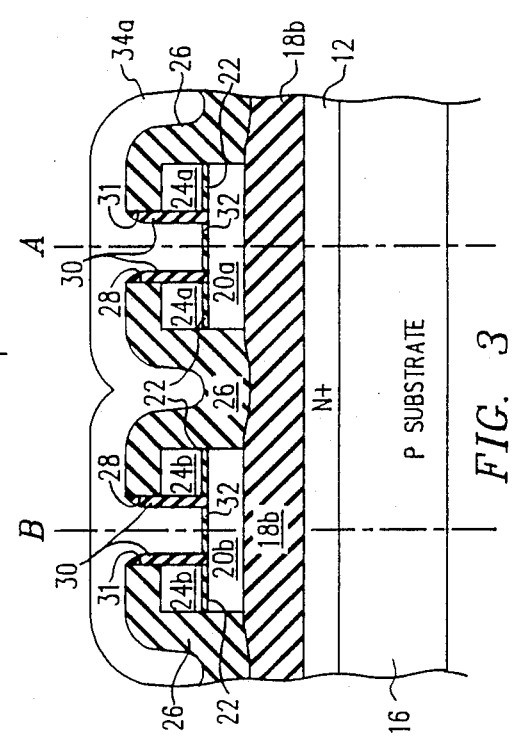

METHOD OF MAKING HIGH DENSITY EEPROM

This is a division of application Ser. No. 07/126,443, filed Nov. 30, 1987, now U.S. Pat. No. 4,853,895.

TECHNICAL FIELD OF THE INVENTION

The present invention relates in general to semiconductor devices. Specifically, the present invention relates to an electrical erasable, programmable read only memory (EEPROM) device which utilizes a floating-gate avalanche injection MOS (FAMOS) programming mechanism.

BACKGROUND OF THE INVENTION

Prior art EEPROM devices place an erase window in the vicinity of an active or channel region of a memory cell transistor. This erase window typically represents a "tunnel" oxide or "leaky" insulating layer. An EEPROM may be quickly programmed or deprogrammed by applying a sufficiently high voltage potential across the erase window so that hot electrons tunnel through the erase window.

EEPROM devices may be programmed or deprogrammed slowly by placing a relatively low voltage potential across the erase window. Accordingly, the placement of an erase window in the active region of a memory cell transistor presents a reliability problem because normal operating conditions encountered while reading the EEPROM place a relatively low voltage potential across the erase window. Consequently, over long periods of time, the normal operation of the EEPROM device may alter a program stored in the EEPROM device.

One prior art solution to this problem is shown in U.S. Pat. No. 4,561,004 by Chang-Kaing Kuo and Shyh-Chang Tsaur, assigned to the assignee of the present invention. This solution places an erase window away from the active region of a memory cell transistor. Thus, a program stored in an EEPROM device remains unaltered in spite of extensive normal read operations because the read operations do not place a voltage potential across the erase window. However, this solution dedicates large sections on the semiconductor substrate to this erase window function. An undesirably low density EEPROM results. Consequently, the industry has a need for an EEPROM structure which removes erase windows from the active regions of memory cell transistors without dedicating semiconductor substrate area to that function.

SUMMARY OF THE INVENTION

Accordingly, it is an advantage of the present invention that an EEPROM cell structure is provided which places an erase window outside a memory cell transistor's active region.

Another advantage of the present invention is that a memory array which uses the present invention need not dedicate semiconductor substrate area to achieving an erase window function. A high density memory array results.

The above advantages of the present invention are carried out in one form by a memory cell constructed on a face of a semiconductor substrate. The substrate exhibits a first conductivity type and contains a buried column line of a second conductivity type. A first insulating layer resides on the substrate face, and a floating gate layer overlies the first insulating layer. A second insulating layer resides on the floating gate layer, and a control gate layer overlies the second insulating layer. A third insulating layer resides on the control gate layer, and a programming electrode overlies the third insulating layer. In addition, a hole or passage exists through the third insulating layer, the control gate layer, and the second insulating layer. This passage is positioned along an imaginary axis that perpendicularly intersects the semiconductor substrate at the column line. Furthermore, an insulator, which is constructed to promote tunneling, resides on the floating gate layer within the passage. Thus, the programming electrode additionally resides within the passage and contacts the insulator.

In another aspect of the present invention, a memory cell is manufactured according to a method wherein a column line exhibiting one conductivity type is implanted into a semiconductor substrate that exhibits an opposing conductivity type. The method grows a first insulating layer over the column line and deposits a first polycrystalline silicon (poly) layer over the first insulating layer. A second insulating layer is formed overlying the first poly layer, and a second poly layer is deposited over the second insulating layer. The method additionally deposits a third insulating layer overlying the second poly layer and etches a passage through the third insulating layer, the second poly layer, and the second insulating layer. This passage is positioned along an imaginary axis that perpendicularly intersects the semiconductor substrate at the column line. The present invention additionally forms a fourth insulating layer on the first poly layer within the etched passage and deposits a third poly layer overlying the third and fourth insulating layers.

BRIEF DESCRIPTION OF THE DRAWINGS

A more complete understanding of the present invention may be derived by referring to the detailed description and claims when considered in connection with the accompanying drawings, in which like reference numbers indicate like features throughout the drawings, and wherein:

FIG. 1 shows a plan view of a portion of an EEPROM array constructed according to the teaching of the present invention;

FIG. 2 shows a cross-sectional view of the subject matter presented in FIG. 1, taken at line 2—2 of FIG. 1;

FIG. 3 shows a cross-sectional view of the subject matter shown in FIG. 1 taken at line 3—3 of FIG. 1; and FIG. 4 shows a cross-sectional view of the subject matter shown in FIG. 1 taken at line 4—4 of FIG. 1.

DETAILED DESCRIPTION

FIGS. 1–4 show various views of a preferred embodiment of an electrically erasable, programmable read only memory (EEPROM) built according to the teaching of the present invention. FIGS. 1–4 show only four cells of a memory array 10. However, memory array 10 represents a cross-point memory array which is organized similarly to the memory array disclosed in U.S. Pat. No. 4,184,207 by David J. McElroy, assigned to the assignee of the present invention, and incorporated herein by reference. Such arrays typically incorporate a multiplicity of parallel bit or column lines that extend the entire length of a memory array. In addition, such arrays typically incorporate a multiplicity of parallel word or row lines that extend the entire width of a memory array. Column and row lines extend generally perpendicular to each other, and a single memory cell is defined for each intersection of a column line with a row line. A particular transistor which forms a single memory cell may be programmed or read by applying appropriate voltages to particular ones of the column and row lines. Those skilled in the art will recognize that current technology permits up to a million or more memory cells within a single semiconductor device. Typically, all cells are constructed as a result of the same process steps, and therefore all cells are similar in structure. Consequently, an entire array of memory cells is described herein by reference to only the four cells shown in FIGS. 1–4.

Referring to FIGS. 1–4 simultaneously, a plan view and various cross-sectional views of memory array 10 are shown. Those skilled in the art will recognize that various features disclosed in FIGS. 1–4 may be exaggerated relative to other features so that a complete description may be clearly presented herein. Memory array 10 is formed on a face 14 of a semiconductor substrate 16. Substrate 16 exhibits a first conductivity type, which in the preferred embodiment is P-type. Substrate 16 and substrate face 14 are most easily observed by referring to FIGS. 2 and 4.

First and second column lines 12a and 12b, respectively, are implanted within substrate 16 at face 14. Column lines 12 are heavily doped to be of a second conductivity type, or of a conductivity type that opposes the conductivity type exhibited by substrate 16. In the preferred embodiment, column lines 12 are N+ type. Accordingly, column lines 12 serve as the source and drains of transistors which are used in forming memory cells contained within memory array 10. Each of column lines 12 serves as a source of one memory cell or a drain of an adjacent cell. Furthermore, column lines 12 represent parallel lines each having a width equivalent to a distance D4 and spaced apart by a predetermined distance equivalent to the sum of a distance D2 and a distance D1 as shown in FIG. 1. In the preferred embodiment, the distance indicated by D4 is approximately 3.5 microns and the distances indicated by D1 and D2, are each established at 1.5 microns. Thus, column lines 12a and 12b are spaced 3 microns apart.

Referring specifically to FIG. 2, channel or active regions 15 exist between column lines 12a and 12b. Active regions 15 include a floating gate transistor region 15a and a selection transistor region 15b. In the preferred embodiment, regions 15a and 15b meet at approximately the midpoint between column lines 12. Moreover, a first insulating layer 18, which contains distinct portions 18a, 18b, and 18c, resides on face 14 of substrate 16. Insulating layer 18 is an oxide that is greater than 200 angstroms thick throughout the cell. Insulating layer portion 18a is a relatively thin section of insulating layer 18 that overlies active region 15a. Relatively thick portion 18b of first insulating layer 18, overlies column lines 12. In addition, relatively thin portion 18c overlies active region 15b. First insulating layer portion 18b is thicker than portion 18a because a process step which is used to grow an oxide that forms insulating layer portions 18a and 18b causes faster growth rates in regions which overlie an implant. Furthermore, relatively thin portion 18c differs from portions 18a and 18b because it is grown in a later-occurring process step (discussed below).

A polycrystalline silicon (poly) layer 20 overlies first insulating layer 18. Poly layer 20 extends laterally between poly-one ends 19 and 21 so that it overlies all of first insulating layer portion 18a and the majority of portion 18b. Poly-one end 19 is approximately centered between column lines 12a and 12b. FIG. 1 shows that poly layer 20 is formed into individual floating gates 20a, 20b, 20c and 20d. Floating gates 20a and 20b are each a distance D5 wide, which in the preferred embodiment is approximately 2.0 microns, reside parallel to each other, and are spaced apart from each other by a distance D6, which is approximately 1.5 microns in the preferred embodiment. Likewise, floating gates 20c and 20d are parallel to each other, each a distance D5 wide, and spaced apart from each other by distance D6. Portions 20a and 20c are colinear, and portions 20b and 20d are colinear.

A second insulating layer 22 overlies poly layer 20 as shown in FIGS. 2 and 3. A polycrystalline silicon (poly) layer 24 overlies second insulating layer 22 and portion 18c of first insulating layer 18. In addition, poly layer 24 is patterned and etched so that it forms first and second control gates 24a and 24b (see FIG. 1). Control gate 24a resides parallel to control gate 24b and is spaced apart from control gate 24b by distance D6. Furthermore, control gates 24 represent row or word lines which extend to opposing sides (not shown) of array 10. Control gates 24 run substantially perpendicular to column lines 12.

Referring now to FIGS. 2–4, a third insulating layer 26 overlies poly layer 24, and a third polycrystalline silicon (poly) layer 34 overlies third insulating layer 26. As shown in FIG. 1, poly layer 34 is patterned and etched into individual, spaced apart parallel strips which represent programming electrodes 34a and 34b. Programming electrodes 34 each have a width equivalent to a distance D3 and run substantially parallel to each other and to column lines 12. Programing electrodes 34 extend to opposing ends (not shown) of memory array 10. In the preferred embodiment, distance D3 is established at approximately 2.0 microns.

Moreover, passages or holes 28 extend through third insulating layer 26, poly layer 24, and second insulating layer 22 to poly layer 20 near poly-one end 21. One of passages 28 exists for each cell in memory array 10. Thus, passages 28a, 28b, 28c, and 28d exist around axes A, B, C, and D, respectively, as shown in FIGS. 1–3. Axes A, B, C, and D represent imaginary lines which extend perpendicularly away from face 14 of substrate 16. Furthermore, axes A, B, C, and D intersect substrate 16 at column lines 12 and extend through floating gates 20a, 20b, 20c, and 20d, respectively, of floating gate layer 20. Passages 28 demonstrate a generally square cross-sectional shape (see FIG. 1) wherein each side of the square is approximately a distance D7 wide. In the preferred embodiment, distance D7 is established at approximately 1.0 micron. Thus, passages 28 are centrally located within the intersections of control gates 24 and floating gates 20 as viewed from the plan view of FIG. 1.

Sidewall insulators 30 reside within passages 28 at boundaries 31. Boundaries 31 represent the boundaries between passages 28 and layers 26, 24, and 22. A tunnel oxide insulating layer 32 resides within each of passages 28 overlying floating gates 20 and extending laterally within limits imposed by sidewall insulators 30. Furthermore, poly layer 34 extends within passages 28 so that it contacts insulators 30 and 32. Consequently, insulator 32 represents an erase window in the present invention.

Moreover, insulator 32 promotes tunneling. For example, insulator 32 may consist of a thin insulator having a thickness of less than 200 angstroms and preferably around 100 angstroms which promotes tunneling due to its thin nature. Alternatively, insulator 32 may consist of a relatively thicker insulator, such as around 500 angstroms thick, installed over texturized polycrystalline silicon. The texturization, or surface roughness, promotes tunneling by field intensification at the points of the texturization. In other words, hot electrons tend to tunnel through insulator 32 when a relatively low voltage, such as 12-17 volts, is applied to layers on opposing sides of insulator 32.

According to a preferred process of manufacturing the present invention, a photoresist mask (not shown) is applied at face 14 of substrate 16. This mask is patterned so as to permit ion implantation of column lines 12 through gaps (not shown) in the photoresist mask. Next, column lines 12 are implanted in semiconductor substrate 16 through this mask and the mask is removed using a conventional process. The substrate is then annealed in, for example, a 900° C. nitrogen environment to ameliorate damage caused to substrate 16 by the prior implantation step and to diffuse column lines 12 into substrate 16.

After the annealing step, an oxide layer is grown on face 14 of substrate 16. This oxide layer forms first insulating layer portion 18a and first insulating layer portion 18b as shown in FIG. 2. The oxide may advantageously be grown in a steam atmosphere at approximately 820° to 850° C. until first insulating layer portion 18a achieves a thickness perpendicular to face 14 of approximately 350 angstroms. This oxide grows more rapidly overlying column lines 12. Consequently, first insulating layer portion 18b achieves a thickness of approximately 3500 to 4000 angstroms in the same amount of time required for portion 18a to achieve a thickness of approximately 350 angstroms. Steam may advantageously be replaced with a dry $O_2$ and HCl mixture at the end of the oxidation growing cycle to improve the quality of the oxide.

At this point in the process, the oxide layer which forms first insulating layer portions 18a and 18b overlies the entire surface area of face 14. Next, poly layer 20 is applied using an LPCVD process. Poly layer 20 achieves a thickness of approximately 3,000 angstroms. Furthermore, the deposition of poly layer 20 represents a low temperature application, preferably at less than 625° C., which tends to maintain poly layer 20 in an amorphous state. After application of poly layer 20, poly layer 20 is doped with phosphorous at an energy level of about 80 KEV and a density of approximately 1E16 atoms/cm$^2$. Next, poly layer 20 is covered with second insulating layer 22.

Second insulating layer 22 may advantageously represent a sandwiched interlevel silicon dioxide/interlevel silicon nitride (ILO/ILN) layer which is formed to be approximately 350 angstroms thick in a manner known to those skilled in the art. The ILO/ILN construction for insulating layer 22 improves capacitance between floating gates 20 and control gates 24 over the capacitance typically obtainable with silicon dioxide only. However, the process of the present invention maintains poly layer 20 at a sufficiently low temperature to keep poly layer 20 in an amorphous state until completion of the application of second insulating layer 22.

After the application of second insulating layer 22, first insulating layer 18, poly layer 20, and second insulating layer 22 reside over the entire surface area of substrate 16. A pattern and etch step which occurs next removes portions of second insulating layer 22, poly layer 20, and the oxide that forms first insulating layer portions 18a and 18b. The etching process used here represents an anisotropic etch which forms substantially vertical walls (perpendicular to face 14) on the remaining portions of second insulating layer 22, poly layer 20, and first insulating layer portions 18a and 18b. Such vertical walls form poly-one ends 19 and 21 shown in FIG. 2. This pattern and etch step removes strips of material which reside substantially parallel to column lines 12, as shown in FIG. 1. The removed material generally overlies active region 15b of substrate 16, as shown in FIG. 2. Thus, although FIG. 1 shows poly layer 20 being etched on four sides to produce floating gate portions 20a–20d, the present pattern and etching step removes material from only two opposing sides of floating gates 20. In addition, this pattern and etch step tends to expose surface 14 of substrate 16 above active region 15b as shown in FIG. 2.

Next, an oxide layer is grown on exposed portions of surface 14 of substrate 16. This oxide represents first insulating layer portion 18c as shown in FIGS. 2–4. The previous pattern and etch step exposed poly-one ends 19 and 21. Consequently, the present oxidation process additionally forms an oxide on poly-one ends 19 and 21 of poly layer 20 as shown in FIG. 2. In the preferred embodiment, first insulating portion 18c is thermally grown to a thickness of approximately 500 angstroms.

After formation of first insulating layer portion 18c, second poly layer 24 is applied overlying the entire surface of substrate 16 using a conventional CVD deposition process. Consequently, portions of poly layer 24 reside over second insulating layer 22 while other portions of poly layer 24 reside over first insulating layer portion 18c, as shown in FIG. 2. Unlike poly layer 20, poly layer 24 may be applied in a crystalline state. The preferred embodiment of the present invention applies poly layer 24 until a thickness of approximately 4500 angstroms is achieved. Poly layer 24 is then implanted with a dopant, such as phosphorus.

Immediately after the application and doping of poly layer 24, poly layer 24 overlies the entire substrate 16. Thus, the process of the present invention next patterns and etches poly layer 24 to produce strips of material which form control gates, such as control gates 24a and 24b shown in FIG. 1. In addition, this pattern and etch step removes material from poly layer 20 thereby forming the remaining two sides for each of floating gates 20a–20d.

This etching step generally removes two poly layers in the area between floating gates 20a and 20b, for example, or floating gates 20c and 20d, for example, as shown in FIG. 1. On the other hand, this etching step removes only one poly layer in the area overlying active region 15b between control gates 24a and 24b. As a consequence, some degree of overetching occurs where only the single poly layer is removed. However, overetching causes no harm at this particular area of substrate 16.

After this etching step, poly layers 20 and 24 have been formed into floating gates 20a–20d and control gates 24a and 24b. in the next step, a tetraethylorthosilicate oxide (TEOS) is deposited to a depth of approximately 1,000 angstroms using a standard CVD process. This TEOS oxide represents third insulating layer 26, as shown in FIGS. 2–4.

Next, a pattern and anisotropic etch process is performed using conventional techniques to provide passages 28. As shown in FIGS. 2 and 3, this etching process removes portions of third insulating layer 26, poly layer 24, and second insulating layer 22 to expose portions of poly layer 20.

Sidewall insulators 30 are formed after the etching of passages 28. Sidewall insulators 30 may advantageously be constructed by first depositing an oxide layer, similar to the TEOS oxide layer discussed above, to a depth of approximately 1,000 angstroms, then anisotropically etching the oxide layer away until the surfaces of poly layer 20 are again exposed.

As discussed above, poly layer 20 was deposited in an amorphous state. Consequently, the exposed surface of poly layer 20 within passages 28 represents a smooth, substantially planar surface when compared to a poly layer which results from application of polycrystalline silicon in a crystalline state. This smoothness improves the manufacturing repeatability of a thin, 100 angstrom tunnel oxide which is applied next.

In the preferred embodiment, the tunnel oxide represents a thin, high quality silicon dioxide layer which may either be grown in a dry $O_2$ and HCl mixture atmosphere at a temperature of around 800° to 850° C. until a thickness of less than 200 angstroms, and preferably around 100 angstroms or less, is achieved or be deposited to a similar thickness. This tunnel oxide represents fourth insulating layer 32, as shown in FIGS. 2 and 3. Since fourth insulating layer 32 is a thin oxide, it promotes the tunneling of hot electrons through insulating layer 32 when voltage potentials (discussed below) are applied across fourth insulating layer 32. The smoothness of poly layer 20 improves manufacturing repeatability of thin tunnel oxides because it tends to guarantee that variance from an average thickness of 100 angstroms will not be great enough to cause a lack of coverage over poly surface 20 by fourth insulating layer 32.

Third poly layer 34 is next deposited over the entire surface of substrate 16. A conventional crystalline, CVD process which achieves an average thickness of approximately 4,500 angstroms will suffice for the application of poly layer 34. This deposition causes poly layer 34 to enter and fill voids remaining in passages 28. Thus, poly layer 34 contacts fourth insulating layer 32 and sidewall insulators 30 within passages 28. The process of the preferred embodiment of the present invention next patterns and etches poly layer 34 into programming electrode strips, such as strips 34a and 34b shown in FIG. 1.

Finally, finishing steps, such as perhaps adding metallic "bit-strapping" layers, and applying approximately 4,000 angstroms of glass with a nitride overcoat (not shown), may be performed to complete the process.

An EEPROM constructed according to the teaching of the present invention may be programmed using different techniques. In one programming technique, a memory cell transistor source, such as column line 12b, may be held at a zero volt potential while a memory cell transistor drain, such as column line 12a, and the memory cell transistor control gate, such as control gate 24a, are raised to a relatively high positive voltage, such as 12.5 volts. This causes an avalanche injection of hot electrons onto a floating gate, such as floating gate 20a. Alternatively, a memory cell drain and source, such as column lines 12a and 12b, may be held at a zero volt potential along with a memory cell control gate, such as control gate 24a. Then, placing a programming electrode, such as programming electrode 34a, at a relatively large negative potential, such as −15 volts, will program a memory cell by causing a tunneling of electrons through fourth insulating layer 32 onto floating gate 20a.

Memory cells may be erased or deprogrammed by placing source, drain and control gate nodes of a memory cell at zero volts while placing a program electrode at a relatively high positive voltage, such as 15-17 volts. This process permits hot electrons to "tunnel" through fourth insulating layer 32 onto programming electrode 34.

Memory cells in the present invention may be read by placing a transistor source such as column line 12a at zero volts while placing a drain, such as column line 12b at a relatively low positive voltage such as from 1-5 volts. The programming electrode is electrically floating during a read operation. Then, the programming of a transistor may be tested by placing the control gate at a relatively low positive voltage, such as 5 volts, and sensing current flowing in column lines 12.

In summary, a reliable memory cell structure and array is provided because an erase window resides away from a memory cell transistor's active region. Since the erase window does not reside near a transistor's active region, it does not experience a voltage potential during normal read operations. Furthermore, a high density memory array results because the erase window may be placed overlying an area of semiconductor substrate 16 which also serves other functions, such as source, drain, and control gate functions for memory cell transistors. In the preferred embodiment a single memory cell requires approximately 22.75 sq. microns of substrate area.

The foregoing description uses a preferred embodiment and process to illustrate the present invention. However, those skilled in the art will recognize that changes and modifications may be made in these embodiments without departing from the scope of the present invention. For example, the permits programming and erasing of single individual memory cells through the application of proper voltage levels to various column lines, row lines, and programming electrode lines. However, those skilled in the art will recognize that an overall block erase function may be simply and easily provided by refraining from etching poly layer 34 so that poly layer 34 forms a single continuous sheet overlying substrate 16. Additionally, those skilled in the art will recognize that programming electrodes 34, and control gates 24 may jog or otherwise be routed so as to permit strapping of column lines 12. Moreover, those skilled in the art will understand that the distances and areas discussed herein will decrease as process technology improves, and that the present invention contemplates such process technology improvements. These and other modifications obvious to those skilled in the art are intended to be included within the scope of this invention.

What is claimed is:

1. A method of manufacturing an electrically erasable, programmable memory cell formed at semiconductor surface area of a first conductivity type, said method comprising the steps of:

forming a column line of a second conductivity type at the surface area, said forming a column line step additionally defining an active region adjacent the column line;

forming a first insulating layer overlying the column line and active region;

forming a first conducting layer overlying the first insulating layer and having a portion thereof extending over the active region;

forming a second insulating layer overlying said first conducting layer;

forming a second conducting layer overlying the second insulating layer;

forming a third insulating layer overlying the second conducting layer;

forming a passage through the third insulating layer, second conducting layer, and second insulating layer, said passage formed adjacent said column line and remote from said active region;

forming a fourth insulating layer on the first conducting layer within said passage of said forming a passage step; and forming a programming electrode within said passage and overlying said fourth insulating layer such that said electrode is remote from said active region.

2. A method as claimed in claim 1 additionally comprising the step of forming, prior to said forming a fourth insulating layer step, a sidewall insulator within said passage of said forming a passage step.

3. A method as claimed in claim 1 wherein said forming a first conducting layer step comprises the step of depositing polycrystalline silicon.

4. A method as claimed in claim 3 wherein said depositing step comprises the step of maintaining said polycrystalline silicon in an amorphous state.

5. A method as claimed in claim 4 additionally comprising the step of implanting a dopant in said polycrystalline silicon during said maintaining step and prior to said forming a second insulating layer step.

* * * * *